US007851863B2

(12) United States Patent
Tokunaga et al.

(10) Patent No.: US 7,851,863 B2
(45) Date of Patent: Dec. 14, 2010

(54) STATIC ELECTRICITY COUNTERMEASURE COMPONENT

(75) Inventors: Hideaki Tokunaga, Fukui (JP); Kenji Nozoe, Fukui (JP)

(73) Assignee: Panasonic Corporation, Osaka (JP)

( * ) Notice: Subject to any disclaimer, the term of this patent is extended or adjusted under 35 U.S.C. 154(b) by 477 days.

(21) Appl. No.: 12/066,606

(22) PCT Filed: Sep. 6, 2006

(86) PCT No.: PCT/JP2006/317663

§ 371 (c)(1),
(2), (4) Date: Mar. 12, 2008

(87) PCT Pub. No.: WO2007/032240

PCT Pub. Date: Mar. 22, 2007

(65) Prior Publication Data

US 2009/0116165 A1 May 7, 2009

(30) Foreign Application Priority Data

Sep. 13, 2005 (JP) ............................. 2005-264980

(51) Int. Cl.
*H01L 23/62* (2006.01)

(52) U.S. Cl. ........................ 257/355; 257/358; 257/359; 257/173; 361/220

(58) Field of Classification Search ................. 257/355, 257/358, 359, 173; 361/220
See application file for complete search history.

(56) References Cited

U.S. PATENT DOCUMENTS

| | | | |
|---|---|---|---|
| 5,552,757 | A | 9/1996 | Blecha et al. |
| 6,251,513 | B1 | 6/2001 | Rector et al. |
| 2002/0050913 | A1 | 5/2002 | Imai et al. |

FOREIGN PATENT DOCUMENTS

| | | |
|---|---|---|
| JP | 4-167401 | 6/1992 |
| JP | 10-308160 | 11/1998 |
| JP | 11-140316 | 5/1999 |
| JP | 2001-523040 | 11/2001 |
| JP | 2002-151307 | 5/2002 |
| JP | 2002-252104 | 9/2002 |
| JP | 2002-538601 | 11/2002 |

OTHER PUBLICATIONS

International Search Report issued Nov. 28, 2006 in the International (PCT) Application No. PCT/JP2006/317663.

*Primary Examiner*—Tan N Tran
(74) *Attorney, Agent, or Firm*—Wenderoth, Lind & Ponack, L.L.P.

(57) ABSTRACT

A static electricity countermeasure component comprising; a ceramic substrate; at least two extractor electrodes opposingly disposed and mutually separated on the ceramic substrate; an over-voltage protective material layer disposed to cover a portion of each extractor electrode and a gap between the extractor electrodes, containing a metal powder and a silicone-based resin; an intermediate layer disposed over the over-voltage protective material layer, containing an insulating powder and a silicone-based resin; and a protective resin layer disposed over the intermediate layer.

7 Claims, 3 Drawing Sheets

STATIC ELECTRICITY COUNTERMEASURE COMPONENT

TECHNICAL FIELD

The present invention relates to a static electricity countermeasure component that protects an electronic device from static electricity.

BACKGROUND ART

In recent years, electronic devices such as cellular telephones and the like are rapidly becoming more compact yet capable of ever higher performance. Along with that, the electronic components used in such electronic devices are also rapidly becoming increasingly compact. However, a drawback is that the voltage endurance of electronic devices and components is decreasing along with that trend for devices to become more compact. As a result, there has been an increase in cases where electrical circuits in the devices are damaged by static electric pulses that are generated when there is contact between the human body and terminals in the electronic device. This is because a high voltage on the order of several hundred- to several kilo-volts is applied by that static electric pulse to the electrical circuit in the device at an ultra-short amount of time of 1 nanosecond or less.

Conventionally, as a countermeasure against such static electric pulses, a method has been implemented that provided a countermeasure component between a line for entry of static electricity and a ground. On the other hand, in recent years, because of the increased speeds for data transmission and reception, signal frequencies of signal lines are increasing to result in the transmission speeds of several hundred Mbps or higher. Along with that, it is preferred that the stray capacitance of the static electricity countermeasure components above be as low as possible in order not to deteriorate the quality of signals transmitted at high speed. Therefore, in case where data is transmitted at speeds higher than several hundred Mbps, a static electricity countermeasure component of low static electric capacitance of 1 pF is required.

As a static electricity countermeasure on a high-speed line, Japanese Unexamined Patent Publication (Kokai) No. 2002-538601, for example, proposes a static electricity countermeasure component of a type that fills an over-voltage protection material between opposing gap electrodes.

As proposed in Japanese Unexamined Patent Publication (Kokai) No. 2002-538601, in the static electricity countermeasure component of the type that fills over-voltage protective material between opposing gap electrodes, a discharge current flows between conductive particles or semi-conducting particles dispersed in the over-voltage protective material that is an insulating material between the opposing gap electrodes when over-voltage by static electricity is applied between the opposing gap electrodes. Static electricity countermeasures are attempted by bypassing that discharge current to a ground as a current.

However, in this type of the static electricity countermeasure component, when the voltage applied by the static electricity becomes higher, the discharge current between the conductive particles generates sparks which can jump beyond the over-voltage protective material in some cases. The resin used in this over-voltage protective material is a silicone-based resin, so although it possesses good tolerance of voltages and durability against heat, its hardness and weather resistance performance are inferior. For that reason, epoxy resin or phenol resin are often used in the outermost protective resin layer. However, these resins have inferior voltage tolerance and heat resistance compared to the silicone-based resin, so if discharge sparks is generated and reach the outermost protective resin layer, the resin may carbonize thereby increasing the possibility of causing insulation deterioration. Therefore, it was difficult with the conventional static electricity countermeasure component to prevent the insulation deterioration caused by static electric pulses.

DISCLOSURE OF THE INVENTION

In view of the problems outlined above, an object of the present invention is to provide a static electricity countermeasure component with a high static electric pulse endurance (insulating resistance) that prevents insulation deterioration of a protective resin layer positioned on an outermost layer, caused upon application of a static electric pulse.

An aspect of the present invention is a static electricity countermeasure component comprising a ceramic substrate; at least two extractor electrodes opposingly disposed and mutually separated on the ceramic substrate; an over-voltage protective material layer disposed to cover a portion of each extractor electrode and a gap between the extractor electrodes, containing a metal powder and a silicone-based resin; an intermediate layer disposed over the over-voltage protective material layer, containing an insulating powder and a silicone-based resin; and a protective resin layer disposed over the intermediate layer.

Objects, features, aspects and advantages of the present invention become more apparent from the following detailed description and accompanying drawings.

BEST MODE FOR CARRYING OUT THE INVENTION

Figure 1:
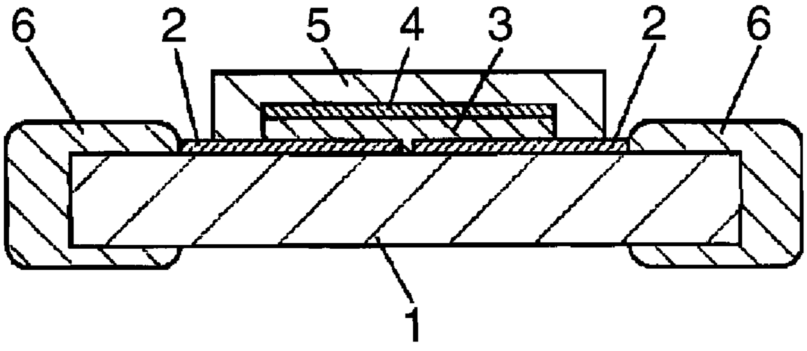
FIG. 1 is a sectional view of a static electricity countermeasure component in accordance with an embodiment of the present invention.
Figure 2:
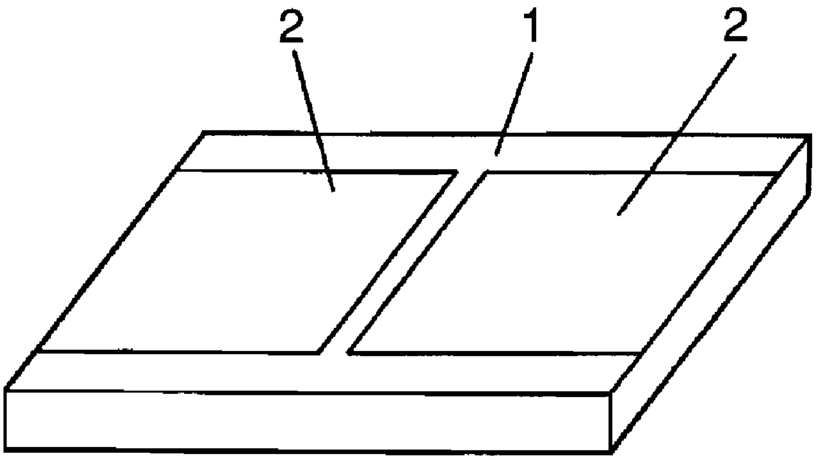
FIG. 2 is an external perspective view of a work-in-progress to explain a process in a manufacturing method of the static electricity countermeasure component in accordance with an embodiment of the present invention.
Figure 3:
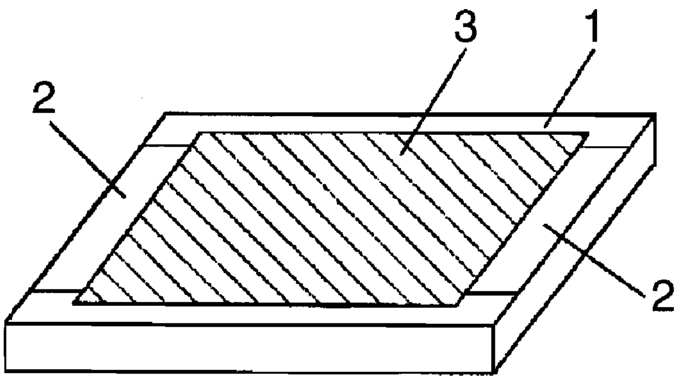
FIG. 3 is an external perspective view of a work-in-progress to explain a process in a manufacturing method of the static electricity countermeasure component in accordance with an embodiment of the present invention.
Figure 4:
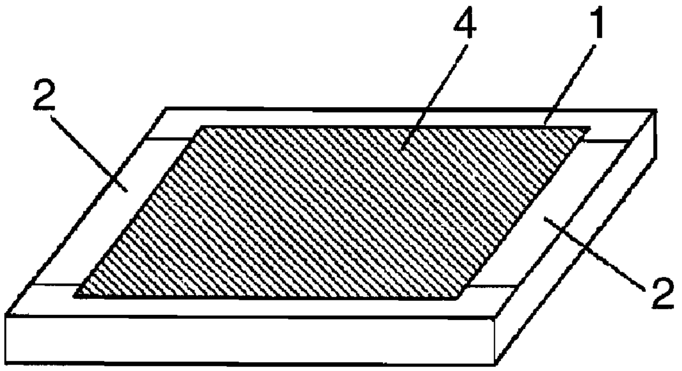
FIG. 4 is an external perspective view of a work-in-progress to explain a process in a manufacturing method of the static electricity countermeasure component in accordance with an embodiment of the present invention.
Figure 5:
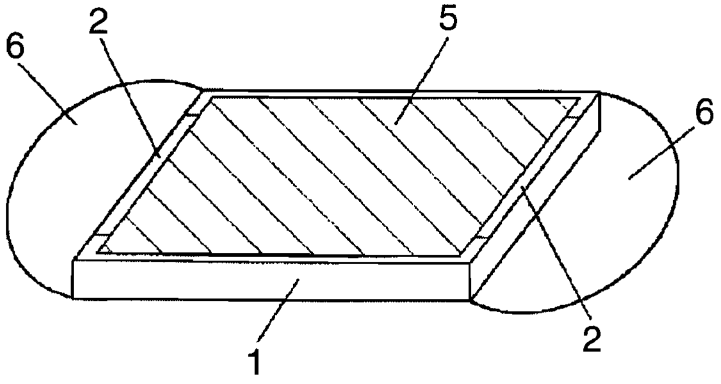
FIG. 5 is an external perspective view of the static electricity countermeasure component attained using the manufacturing method of the static electricity countermeasure component in accordance with an embodiment of the present invention.

An embodiment of the present invention will now be explained with reference to FIGS. 1 to 5. FIG. 1 is a sectional view of the static electricity countermeasure component in accordance with an embodiment of the present invention; FIGS. 2 to 4 are external perspective views of a work-in-progress to explain a process in a manufacturing method of the static electricity countermeasure component; and FIG. 5 is an external perspective view of the static electricity countermeasure component attained using the manufacturing method.

As shown in FIG. 1, the static electricity countermeasure component in according with an embodiment of the present invention is equipped with a ceramic substrate 1; at least two extractor electrodes 2 opposingly disposed and mutually separated at a predetermined distance on the ceramic substrate 1; an over-voltage protective material layer 3 disposed to cover a portion of each extractor electrode 2 and a gap between the extractor electrodes 2, containing a metal powder and a silicone-based resin; an intermediate layer 4 disposed over the over-voltage protective material layer 3, containing an insulating powder and a silicone-based resin; and a protective resin layer 5 disposed over the intermediate layer 4.

To reduce stray capacitance generated between electrodes, a material with a low dielectric constant of 50 or less, and preferably 10 or less, is preferred as the material of the ceramic substrate 1. As such a low dielectric constant material, alumina (aluminum oxide) can be offered as an example. The ceramic substrate can be attained by baking the low dielectric constant material such as alumina at 900 to 1,300° C., for example.

As shown in FIG. 1, at least two extractor electrodes 2 are disposed on the ceramic substrate 1, mutually opposed and separated at a predetermined distance.

As metals that compose the extractor electrodes 2, at least one kind of metal is preferred to be selected from the group consisting of Cu, Ag, Au, Cr, Ni, Al and Pd.

The extractor electrodes 2 are formed so that at least two extractor electrodes 2 oppose each other with the pattern shown in FIG. 2, using spattering, deposition or the like. The thickness of these extractor electrodes 2 is on the order of 10 nm to 20 μm. The pattern shown in FIG. 2 can be formed by spattering or deposition from above a mask, or by etching using a photolithography method after forming one of the extractor electrodes.

The number of extractor electrodes 2 can be set to an appropriate number depending on the number of lines determined by the circuit of the set. In a case where there are three or more extractor electrodes 2, the pattern is formed in the same way as a case where there are two extractor electrodes 2. In a case of three or more extractor electrodes 2, it is preferred to form a pattern using the photolithography method in consideration of the pattern becoming more complex.

In view of improving the effect of the over-voltage protection by the over-voltage protective material, it is preferred that the distance between the two opposing extractor electrodes 2 is narrow, more preferably being 50 μm or less. In order to narrow the gap between two extractor electrodes 2, it is preferred to use the photolithography method.

The over-voltage protective material layer 3 contains a metal powder and a silicone-based resin and, as shown in FIG. 1, covers a portion of each of the extractor electrodes 2 and the gap between the extractor electrodes 2.

The over-voltage protective material layer 3 that exists between the mutually separated and opposing extractor electrodes 2 is in a high-impedance state under normal use (at a rated voltage) because the contained silicone-based resin has a resistance property. However, when a high voltage such as a static electric pulse is applied, a discharge current is generated between the metal powder that exists through the silicone-based resin in the over-voltage protective material layer 3, and impedance is notably reduced. Therefore, by utilizing that phenomenon, it is possible to bypass abnormal voltages such as static electric pulses and surges to a ground. This makes it possible to securely avoid deterioration of the insulation property of the over-voltage protective material layer 3 caused by static electric pulses.

As the metal powder contained in the over-voltage protective material layer 3, the powder of at least one kind of metal selected from the group consisting of Ni, Al, Ag Pd, and Cu is preferred. Also, it is preferred that the metal powder contains spherical particles whose average particle diameters are on the order of 0.3 to 10 μm. It is more preferred that the metal powder is composed of substantially only the spherical particles.

It is preferred that a content ratio of the metal powder in the over-voltage protective material layer is 40 percent by volume or less. When the ratio exceeds 40 percent by volume, the silicone-based resin component in the particle areas ensuring insulation becomes relatively reduced. This causes more easily insulation breakdown between the particles when high voltages are applied. The content ratio of the metal powder is preferrably 10 percent by volume or more in consideration of bypassing discharge current to a ground which is generated between the metal powders when high voltages are applied.

It is preferred that the silicone-based resin contained in the over-voltage protective material layer 3 contains a polysiloxane which has a siloxane bond (—Si—O—Si—) as its principal chain and an organic group binding to the principal chain as a side chain. The basic skeleton of polysiloxane is composed of a bond of silicon with oxygen as that of silica. For that reason, compared to organic resins, such as epoxy resins or phenol resins, having the basic skeleton composed of a bond of carbons or a bond of carbon with oxygen, the silicone-based resin has a superior effect of preventing deterioration of the insulation. Therefore, if the silicone-based resin is used as the resin for the over-voltage protective material layer 3, it is possible to dramatically improve insulation durability toward abnormal voltages.

As the silicone-based resin contained in the over-voltage protective material layer 3, it is preferred that the organic component of the side chain is reduced as low as possible to improve the effect of preventing deterioration of the insulation. In view of that, it is preferred that the silicone-based resin contains the polysiloxane such as methyl silicone and dimethyl silicone having a methyl group with the lowest carbon number as the organic group of the side chain.

As a method for manufacturing the over-voltage protective material layer 3, an appropriate amount of an organic solvent is added to a mixture of the metal powder described above and the silicone-based resin described above, then the mixture is kneaded and dispersed using a three-piece rolling mill to initially produce an over-voltage protective material paste. The over-voltage protective material paste is then printed to a thickness of 5 to 50 μm using a screen-printing technique, as shown in FIG. 3, then dried at 150° C. for 5 to 15 minutes to form the over-voltage protective material layer 3. Then, the over-voltage protective material layer 3 is formed to a pattern so as to cover a portion of each of two extractor electrodes 2 opposingly disposed and mutually separated, and a gap between the extractor electrodes 2.

The intermediate layer 4 contains an insulating powder and a silicone-based resin. As shown in FIG. 1, this layer is disposed between the over-voltage protective material layer 3 and the protective resin layer 5. It is preferred that the intermediate layer 4 is disposed so as to cover the over-voltage protective material layer 3. By using the intermediate layer 4, it is possible to securely prevent deterioration of the insulation of the protective resin layer 5.

In other words, because the over-voltage protective material layer 3 is made of a material that is sensitive to an abnormal voltage such as static electricity, if the abnormal voltage occurs, the current flows also near the surface of the over-voltage protective material layer 3 that is most separated from the ceramic substrate 1. On the other hand, the protective resin layer 5 at the highest layer is generally formed using epoxy resin and phenol resin and the like because a silicone-based resin is difficult to provide adequate hardness and weather resistance. Therefore, if the protective resin layer 5 containing organic resins such as epoxy resins and phenol resins having the basic skeleton composed of a bond of carbons or a bond of carbon with oxygen is in direct contact with the over-voltage protective material layer 3, the insulation will be deteriorated in the protective resin layer 5 when the current flows near the surface of the over-voltage protective material layer 3. If the intermediate layer 4 whose main component is the silicone-based resin is disposed between the over-voltage protective material layer 3 and the protective resin layer 5, it is possible to dramatically prevent deterioration of the insulation of the protective resin layer 5. Specifically, since the intermediate layer 4 has no electrical conductivity even to abnormal voltages such as static electricity and the like, discharge sparks do not reach to the surface. As the result, the protective resin layer 5 formed using epoxy resin and the like which is positioned above the intermediate layer 4 does not experience deterioration of the insulation.

As the insulating powder contained in the intermediate layer 4, a powder of insulation containing an oxide of at least one kind of metal selected from the group consisting of Al, Si, and Mg, or a complex oxide of such metals is preferred. It is acceptable to use one, or a combination of two or more kinds. As the metal oxide, $Al_2O_3$, $SiO_2$, and MgO can be used. Also, as the complex oxide, mullite ($3Al_2O_3.2SiO_2$), and steatite ($MgO.SiO_2$) can be offered as examples. It is preferred that the average particle diameter of the insulating powder is on the order of 0.3 to 10 μm. Also, it is preferred to use the insulating powder having a high insulating property with no electrical conductivity even to abnormal voltages such as static electricity, and having a specific volume resistance of $10^{13}$ Ω·cm or more at room temperature.

It is preferred that the content ratio of the insulating powder in the intermediate layer is 40 percent by volume or less. When the ratio exceeds 40 percent by volume, discharge sparks leak easily at the interface of the insulating powder and the silicone-based resin. As a result, the discharge sparks caused by static electric pulses reach the protective resin layer 5 being the outermost layer and deterioration of its insulation tends to take place. Also, the insulating powder plays a role of being a filler for performing the screen printing with more accuracy. Therefore, as long as a good quality print is attained, the content ratio of the insulating powder is preferred to be 30 percent by volume or less. The content ratio of the insulating powder is preferred to be 10 percent by volume or more in view of attaining a precise screen print.

As the silicone-based resin contained in the intermediate layer 4, it is preferred that the organic component of the side chain is minimized to improve the effect of preventing deterioration of the insulation, in the same way as the silicone-based resin contained in the over-voltage protective material layer 3. In view of that, it is preferred that the silicone-based resin contains the polysiloxane (methyl silicone, dimethyl silicone and the like) having the methyl group as the organic group of the side chain.

The thickness of the intermediate layer is preferred to be 5 μm or more. If the thickness of the intermediate layer is less than 5 μm, the effect of preventing deterioration of the insulation of the protective resin layer 5 will be reduced. If the thickness of the intermediate layer is substantially 50 μm or less, it is acceptable in view of its manufacturability.

Also, it is preferred that the sum of the thickness of the intermediate layer and the thickness of the over-voltage protective material layer is 30 μm or more. By adjusting the sum of the thicknesses of both layers to 30 μm or more, namely by increasing the thickness of the over-voltage protective material layer if the thickness of the intermediate layer is thin, or by increasing the thickness of the intermediate layer if the thickness of the over-voltage protective material layer is thin, it is possible to further improve the effect of preventing deterioration of the insulation of the protective resin layer 5. If the sum of the thicknesses of the intermediate layer and over-voltage protective material layer is substantially 80 μm or less, it is acceptable in view of its handling and manufacturability.

As a method for manufacturing the intermediate layer 4, an appropriate amount of an organic solvent is added to a mixture of the insulating powder described above and the silicone-based resin described above, then the mixture is kneaded and dispersed using a three-piece rolling mill to initially produce an intermediate layer paste. This intermediate layer paste is then printed to a thickness of 5 to 50 μm using a screen-printing technique, as shown in FIG. 4, so as to cover the over-voltage protective material layer 3. In this process, the intermediate layer 4 is printed so as to completely cover the over-voltage protective material layer 3 which is positioned above and between the two opposing extractor electrodes 2. Then, the print is dried at 150° C. for 5 to 15 minutes to form the intermediate layer 4.

The protective resin layer 5 is disposed above the intermediate layer 4. It is preferred that the protective resin layer 5 is disposed so as to completely cover the over-voltage protective material layer 3 and intermediate layer 4. To ensure adequate hardness and weather resistance of the protective resin layer 5, it is preferred that the layer is formed of an organic resin whose basic skeleton is composed of a bond of carbons or a bond of carbon with oxygen, such as epoxy resin or phenol resin.

A protective resin paste composed of epoxy resin or phenol resin is printed to form the protective resin layer 5 to a thickness of 10 to 100 μm using the screen printing technique and dried at 150° C. for 5 to 15 minutes, to completely cover the over-voltage protective material layer 3 and the intermediate layer 4, and to leave the edge portions of the extractor electrodes 2 at both ends. Thereafter, the print is cured at 150 to 200° C. for 15 to 60 minutes to form the protective resin layer 5.

As shown in FIG. 5, the static electricity countermeasure component can be manufactured by forming terminal electrodes 6 at both ends of the ceramic substrate 1, the electrodes 6 being electrically connected to at least two of the extractor electrodes 2. As shown in FIG. 1, the terminal electrodes 6 can be formed at both ends of the ceramic substrate 1 by applying an electrode paste composed of a metal powder such as Ag and the like, and a curable resin such as epoxy resin, followed by drying and curing so as to electrically connect to the edges of the extractor electrodes 2.

Although the present invention has been described in terms of the presently preferred embodiments, such embodiments are illustrative in all aspects and are not to be interpreted as restrictive. It is to be construed that an unlimited number of modifications not described above are embodied without departing from the scope of the present invention.

Hereinafter, the present invention will be described with reference to Examples, but it should be understood that the present invention is not limited by these Examples.

EXAMPLES

The static electricity countermeasure component for each Test Example was manufactured and the following static electricity test was conducted.

Figure 6:
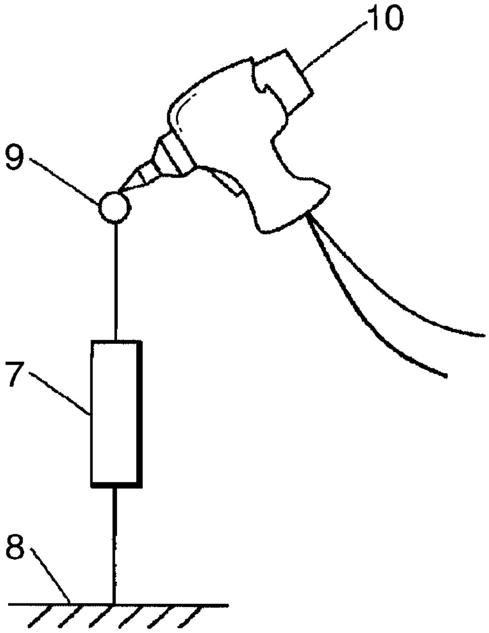
FIG. 6 is a schematic view showing a static electricity testing method for the static electricity countermeasure component in accordance with an embodiment of the present invention.

As shown in FIG. 6, in the static electricity test, a terminal of one static electricity countermeasure component 7 was grounded to the ground 8, and a static electricity test gun 10 was touched to the static electricity pulse charger 9 projecting from the terminal of the other end. Static electric pulses were applied in this manner. The static electricity tests were conducted under conditions that conform to a human analog model IEC61000 (Discharge resistance: 330Ω; discharge capacity 150 pF; applied voltage: 8 kV).

In the evaluation after the static electricity test, it was determined as a breakdown if the insulation resistance value (measured at DC 25 V) was less than $10^8$Ω after applying the static electric pulse.

Test Example 1 and Comparative Example 1

Tests were conducted on the static electricity countermeasure component having various thicknesses of intermediate layer 4 in comparison with a static electricity countermeasure component having no intermediate layer. In these tests, as the metal powder in the over-voltage protective material layer 3, Al having an average particle diameter of 1 μm was used and the content ratio of Al was 40 percent by volume. Also, as the insulating powder in the intermediate layer 4, a mixed powder of $SiO_2$ and $Al_2O_3$ with an average particle diameter of approximately 1 μm was used. The content ratio of the mixed powder of $SiO_2$ and $Al_2O_3$ was 40 percent by volume. Also, epoxy resin was used in the protective resin layer 5. The gap between the opposing extractor electrodes 2 was 25 μm.

Table 1 shows the results of the tests.

TABLE 1

| | Test Example 1 | | | Comparative |
|---|---|---|---|---|
| | 1-1 | 1-2 | 1-3 | Example 1 |
| Over-voltage Protective Material Layer Thickness (μm) | 20 | 20 | 20 | 20 |
| Intermediate Layer Thickness (μm) | 5 | 10 | 15 | No Intermediate Layer |
| Number of Breakdown Components (Out of 100) | 3 | 0 | 0 | 10 |

As is clearly shown in Table 1, if no intermediate layer 4 was provided, 10 components out of 100 were damaged by breakdown, but the number of breakdown components was reduced by providing the intermediate layer 4. The breakdown did not occur when the thickness of the intermediate layer 4 was increased.

Test Example 2 and Comparative Example 2

Static electricity countermeasure components were manufactured in which a thickness of over-voltage protective material layer 3 and a thickness of intermediate layer 4 were changed, and tests were conducted to compare with the static electricity countermeasure components having no intermediate layer. The compositions of the over-voltage protective material layer 3 and intermediate layer 4, and the gap between the extractor electrodes 2 were same as those of the static electricity countermeasure component used in Test Example 1.

Table 2 shows the results of the tests.

TABLE 2

| | Test Example 2 | | | | | | | | | | Comparative Example 2 | |
|---|---|---|---|---|---|---|---|---|---|---|---|---|
| | 2-1 | 2-2 | 2-3 | 2-4 | 2-5 | 2-6 | 2-7 | 2-8 | 2-9 | 2-10 | 2-1 | 2-2 |
| Over-voltage Protective Material Layer Thickness (μm) | 10 | 10 | 10 | 10 | 30 | 30 | 30 | 40 | 40 | 40 | 30 | 40 |
| Intermediate Layer Thickness (μm) | 10 | 15 | 20 | 25 | 5 | 10 | 15 | 5 | 10 | 15 | No Intermediate Layer | No Intermediate Layer |
| Number of Breakdown Components (Out of 100) | 5 | 2 | 0 | 0 | 0 | 0 | 0 | 0 | 0 | 0 | 8 | 6 |

As is clearly shown in Table 2, at each thickness of 10 μm, 30 μm, and 40 μm on the over-voltage protective material layer 3, the numbers of breakdown components decreased as the thickness of the intermediate layer 4 was increased.

It can be understood from the results shown in Tables 1 and 2 that, by providing intermediate layer 4 composed of the silicone-based resin and the insulating powder, the tolerance to static electric pulses is greatly improved. If the sum of the thicknesses of the over-voltage protective material layer 3 and the intermediate layer 4 was 30 μm or more, even better results were attained.

Test Example 3

Tests were conducted on static electricity countermeasure components whose content ratio of Al was changed for the metal powder in the over-voltage protective material layer 3. In these tests, Al having an average particle diameter of 1 μm was used as the metal powder in the over-voltage protective material layer 3, and the thickness of the over-voltage protective material layer 3 was set at 20 μm. Also, as the insulating powder in the intermediate layer 4, a mixed powder of $SiO_2$ and $Al_2O_3$ with an average particle diameter of 1 μm was used. The content ratio of the mixed powder of $SiO_2$ and $Al_2O_3$ was 40 percent by volume. Also, the thickness of the intermediate layer 4 was set at 10 μm and epoxy resin was used in the protective resin layer 5. The gap between the opposing extractor electrodes 2 was 25 μm.

Table 3 shows the number of defective components when the initial characteristics were evaluated for the static electricity countermeasure component having a different content ratio of Al. The initial characteristics were evaluated by degradation of the initial insulation resistance, and components were evaluated as having a defect when the initial insulation resistance was less than $10^8 \Omega$.

TABLE 3

| | Test Example 3 | | | | | |
|---|---|---|---|---|---|---|
| | 3-1 | 3-2 | 3-3 | 3-4 | 3-5 | 3-6 |
| Content Ratio of Al (% by Volume) | 30 | 35 | 40 | 45 | 50 | 55 |
| Number of Initial Defective Components (Out of 100) | 0 | 0 | 0 | 2 | 4 | 12 |

As is clearly shown in Table 3, by raising the content ratio of Al, initial defects of components began to occur, and further increased. It is considered that the trend is caused by an increase in the frequency of contact of the metal powder. Therefore, beyond a certain level of the content ratio, there is a trend not to be able to ensure insulation even by raising the dispersed state. That value was found to be higher than 40 percent by volume, as is clearly shown in Table 3.

Table 4 shows the results for the static electricity countermeasure component having a different content ratio of Al. The tests were conducted on non-defective components, excluding the initial defective components.

TABLE 4

| | Test Example 3 | | | | | |
|---|---|---|---|---|---|---|
| | 3-1 | 3-2 | 3-3 | 3-4 | 3-5 | 3-6 |
| Content Ratio of Al (% by Volume) | 30 | 35 | 40 | 45 | 50 | 55 |
| Number of Breakdown Components (Out of 100) | 0 | 0 | 0 | 3 | 5 | 7 |

As is clearly shown in Table 4, by raising the content ratio of Al, insulation defects of components began to occur, and further increased. In the similar way as in Table 3, it was shown that breakdowns began to occur at a point exceeding 40 percent by volume. It is considered because, when the content ratio of Al is high, the resin component in the particle areas that ensures insulation is relatively lower, thus the insulation breakdown between the particles takes place easily when a high voltage is applied. In a range of the particle diameter of Al between 0.3 and 10 μm, the results that indicate the same trends as shown in Table were attained even when the content ratio of Al was changed.

Test Example 4

Using $SiO_2$ and/or $Al_2O_3$ as the insulating powder in the intermediate layer 4, tests were conducted on the static electricity countermeasure component in which the content ratio of the insulating powder was changed. In these tests, Al having an average particle diameter of 1 μm was used as the metal powder in the over-voltage protective material layer 3; the content ratio of the Al was set at 40 percent by volume, and the thickness of the over-voltage protective material layer 3 was set at 20 μm. As the insulating powder in the intermediate layer 4, $SiO_2$ or $Al_2O_3$ with an average particle diameter of 1 μm, or mixtures of these powders was used. Also, the thickness of the intermediate layer 4 was set at 10 μm and epoxy resin was used in the protective resin layer 5. The gap between the opposing extractor electrodes 2 was 25 μm.

Table 5 shows the results.

TABLE 5

| | Test Example 4 | | | | | | | | | | | | | | | | | | |
|---|---|---|---|---|---|---|---|---|---|---|---|---|---|---|---|---|---|---|---|
| | 4-1 | 4-2 | 4-3 | 4-4 | 4-5 | 4-6 | 4-7 | 4-8 | 4-9 | 4-10 | 4-11 | 4-12 | 4-13 | 4-14 | 4-15 | 4-16 | 4-17 | 4-18 | 4-19 |
| Content Ratio of $SiO_2$ (% by Volume) | 0 | 10 | 20 | 30 | 0 | 10 | 20 | 30 | 40 | 0 | 15 | 30 | 45 | 0 | 10 | 20 | 30 | 40 | 50 |
| Content Ratio of $Al_2O_3$ (% by Volume) | 30 | 20 | 10 | 0 | 40 | 30 | 20 | 10 | 0 | 45 | 30 | 15 | 0 | 50 | 40 | 30 | 20 | 10 | 0 |
| Number of Breakdown Components (Out of 100) | 0 | 0 | 0 | 0 | 0 | 0 | 0 | 0 | 0 | 3 | 2 | 2 | 3 | 6 | 5 | 4 | 4 | 4 | 6 |

As shown in Table 5, if the content ratio of the insulating powder exceeds 40 percent by volume, deterioration of the insulation caused by static electric pulses begins to occur. It is considered because, although the intermediate layer 4 prevents discharge sparks caused by static electricity from being generated to the outermost layer of the protective resin layer 5 when static electric pulses are applied, if there is too much insulating powder in the intermediate layer 4, discharge sparks easily leak at the boundary face of the insulating powder and the resin. As the result, the discharge sparks caused by static electricity reach up to the outermost protective resin layer 5 to cause deterioration of insulation.

As explained above, an aspect of the present invention is a static electricity countermeasure component comprising a ceramic substrate; at least two extractor electrodes opposingly disposed and mutually separated on the ceramic substrate; an over-voltage protective material layer disposed to cover a portion of each extractor electrode and a gap between the extractor electrodes, containing a metal powder and a silicone-based resin; an intermediate layer disposed over the over-voltage protective material layer, containing an insulating powder and a silicone-based resin; and a protective resin layer disposed over the intermediate layer. According to the above configuration, because the intermediate layer containing the insulating powder and the silicone-based resin is disposed between the over-voltage protective material layer and the outermost protective resin layer, it is possible to prevent deterioration of the insulation in the protective resin layer positioned at the outermost layer that is caused by the applied static electric pulse. This makes it possible to provide the static electricity countermeasure component having superior tolerance to static electric pulses.

It is preferred that the insulating powder contains an oxide of at least one kind of metal selected from the group consisting of Al, Si, and Mg, or a complex oxide of the metals. According to the above configuration, since the insulating powder having a high insulating property is contained in the intermediate layer, it is possible to securely prevent deterioration of the protective resin layer that is caused by the applied static electric pulses.

It is preferred that a content ratio of the insulating powder in the intermediate layer is 40 percent by volume or less. According to the above configuration, it is possible to further reduce the deterioration of the insulation caused by static electric pulses.

Also, the silicone-based resin preferably contains polysiloxane having a methyl group as an organic group of the side chain. According to the above configuration, since the polysiloxane has a siloxane bond as its principal chain and the methyl group with a low organic component as its side chain, superior effect in preventing the deterioration of the insulation is obtainable.

Also, it is preferred that the thickness of the intermediate layer is 5 μm or more and that the sum of the thicknesses of the intermediate layer and the over-voltage protective material layer is 30 μm or more. According to the above configuration, it is possible to further securely prevent the deterioration of the insulation caused by static electric pulses.

The metal powder preferably contains at least one kind of metal selected from the group consisting of Ni, Al, Ag, Pd, and Cu. According to the above configuration, when the static electric pulse is applied, a discharge current is generated between the metal powders in the over-voltage protective material layer, enabling impedance to reduce and abnormal voltage to bypass to the ground. This makes it possible to securely prevent the deterioration of the insulation of the over-voltage protective material layer that is caused by the static electric pulse.

It is also preferred that the content ratio of the metal powder in the over-voltage protective material layer is 40 percent by volume or less. According to the above configuration, it is possible to further securely reduce the deterioration of the insulation caused by the static electric pulses.

INDUSTRIAL APPLICABILITY

The static electricity countermeasure component of the present invention is equipped with a ceramic substrate; at least two extractor electrodes opposingly disposed and mutually separated on the ceramic substrate; an over-voltage protective material layer disposed to cover a portion of each extractor electrode and a gap between the extractor electrodes, containing a metal powder and a silicone-based resin; an intermediate layer disposed over the over-voltage protective material layer, containing an insulating powder and a silicone-based resin; and a protective resin layer disposed over the intermediate layer. By providing the intermediate layer, it is possible to prevent deterioration of the insulation of the protective resin layer positioned at the outermost layer that is caused by applied static electric pulses, thus to provide the static electricity countermeasure component with a high tolerance to the static electric pulses.

The invention claimed is:

1. A static electricity countermeasure component comprising:

- a ceramic substrate;
- at least two extractor electrodes opposingly disposed and mutually separated on the ceramic substrate;
- an over-voltage protective material layer disposed to cover a portion of each extractor electrode and a gap between the extractor electrodes, containing a metal powder and a silicone-based resin;
- an intermediate layer disposed over the over-voltage protective material layer, containing an insulating powder and a silicone-based resin; and
- a protective resin layer disposed over the intermediate layer.

2. The static electricity countermeasure component according to claim 1, wherein the insulating powder contains an oxide of at least one kind of metal selected from the group consisting of Al, Si, and Mg, or a complex oxide of the metals.

3. The static electricity countermeasure component according to claim 1, wherein a content ratio of the insulating powder in the intermediate layer is 40 percent by volume or less.

4. The static electricity countermeasure component according to claim 1, wherein the silicone-based resin contains polysiloxane having a methyl group as an organic group of the side chain.

5. The static electricity countermeasure component according to claim 1, wherein the thickness of the intermediate layer is 5 μm or more, and the sum of the thicknesses of the intermediate layer and the over-voltage protective material layer is 30 μm or more.

6. The static electricity countermeasure component according to claim 1, wherein the metal powder contains at least one kind of metal selected from the group consisting of Ni, Al, Ag, Pd, and Cu.

7. The static electricity countermeasure component according to claim 1, wherein a content ratio of the metal powder in the over-voltage protective material layer is 40 percent by volume or less.

* * * * *